(12) United States Patent
Rudaitis et al.

(10) Patent No.: US 9,244,098 B2
(45) Date of Patent: Jan. 26, 2016

(54) BANANA JACK ADAPTER FOR TEST SWITCH

(71) Applicants: Erick William Rudaitis, Sterling Heights, MI (US); Gregory L. Zook, Toledo, OH (US)

(72) Inventors: Erick William Rudaitis, Sterling Heights, MI (US); Gregory L. Zook, Toledo, OH (US)

(73) Assignee: E.J. Brooks Company, Farmington Hills, MI (US)

( * ) Notice: Subject to any disclaimer, the term of this patent is extended or adjusted under 35 U.S.C. 154(b) by 521 days.

(21) Appl. No.: 13/647,251

(22) Filed: Oct. 8, 2012

(65) Prior Publication Data

US 2014/0097827 A1    Apr. 10, 2014

(51) Int. Cl.
*G01R 1/20* (2006.01)
*G01R 1/04* (2006.01)
*H01R 13/10* (2006.01)
*G01R 35/04* (2006.01)

(52) U.S. Cl.
CPC .............. *G01R 1/0416* (2013.01); *G01R 35/04* (2013.01); *H01R 13/10* (2013.01)

(58) Field of Classification Search
CPC ....... G01R 1/0416; G01R 35/04; H01R 13/10
See application file for complete search history.

(56) References Cited

U.S. PATENT DOCUMENTS

| | | | | |
|---|---|---|---|---|
| 5,023,747 A * | 6/1991 | Lindsay | | 361/117 |
| 6,520,798 B1 * | 2/2003 | Robinson et al. | | 439/517 |
| 7,458,846 B2 * | 12/2008 | Loehr et al. | | 439/517 |

* cited by examiner

*Primary Examiner* — Tung X Nguyen
(74) *Attorney, Agent, or Firm* — Bejin Bieneman PLC

(57) ABSTRACT

An improved banana jack adapter assembly is provided for use in connection with a test switch in a utility meter application. The banana jack adapter assembly improves connectability of testing equipment to a meter box test switch when a field operator desires to calibrate a meter of a utility box.

17 Claims, 5 Drawing Sheets

BANANA JACK ADAPTER FOR TEST SWITCH

FIELD OF THE INVENTION

An apparatus and method for aiding and conducting tests on utility devices and, more particularly, an improved banana jack adapter for use with a test switch that is in a utility meter box.

BACKGROUND AND BRIEF SUMMARY OF THE INVENTION

It is well known to provide a meter box at various residential and commercial locations. A typical utility meter box assembly includes a test switch and a meter and the meter provides the function of measuring the amount of kilowatts that is being used by the consumer. Because the meter is an electromechanical device, it requires routine maintenance in order to assure the meter is operating properly and also to make certain it is properly calibrated. If the meter is not properly calibrated, then the utility company could be wasting energy and resources and reducing profits.

There are various methods of calibrating a meter in the field in order to assure it is properly functioning. One such example is to provide a test switch, which is placed in communication with the meter. The test switch provides easy multi-circuit testing of switchboard relays, meters and other instruments that may be present in the meter box.

Traditionally, a test switch includes a test switch ear that is nothing more than a post for a temporary attachment of alligator style test clips to a stud of the test switch. The alligator style test clips, once connected to the ear, allow an outside testing device, such as a voltage flow diagnostic tool, to be connected to the meter where diagnostic tests can be performed. The problem with the traditional test switch ear is that in use the alligator style test clips can be accidentally bumped, thus causing the clip to short against adjacent electrical components or even to become entirely dislodged from the ear. Such an event can be dangerous as up to 480 volts can run through the switch at any given time. If the alligator clip becomes dislodged, it could also cause an operator to become injured. Further, the test switch and the surrounding enclosure could be damaged if the alligator clips are somehow shorted against other switches that are within the switch housing. Also, there are other inefficiencies such as loss of employee time if the alligator clips disengage from the traditional test switch ear as it may require the operator to reconnect the alligator clips to the test ear.

Thus, it would be desirable to provide an improved adapter for test switches that are used with utility boxes. It would also be desirable to provide an adapter for use with test switches that is operable to be utilized with banana jack style assemblies which in turn can be connected to test equipment.

One such example includes a test jack adapter for use with a test switch, which can be used with a utility meter box. The adapter includes a bracket made of conductive material that is operable to be secured to a switch stud, an elongated hollow body that is made of conductive material, an insulated washer that slides over the elongated hollow body, an insulated member that is operable to receive a portion of the insulated washer, and a nut for securing the elongated hollow body to the bracket. It will be appreciated that the test jack adapter can be part of a test switch assembly that may have a test switch cover.

DETAILED DESCRIPTION OF THE PREFERRED EMBODIMENTS

Figure 1:
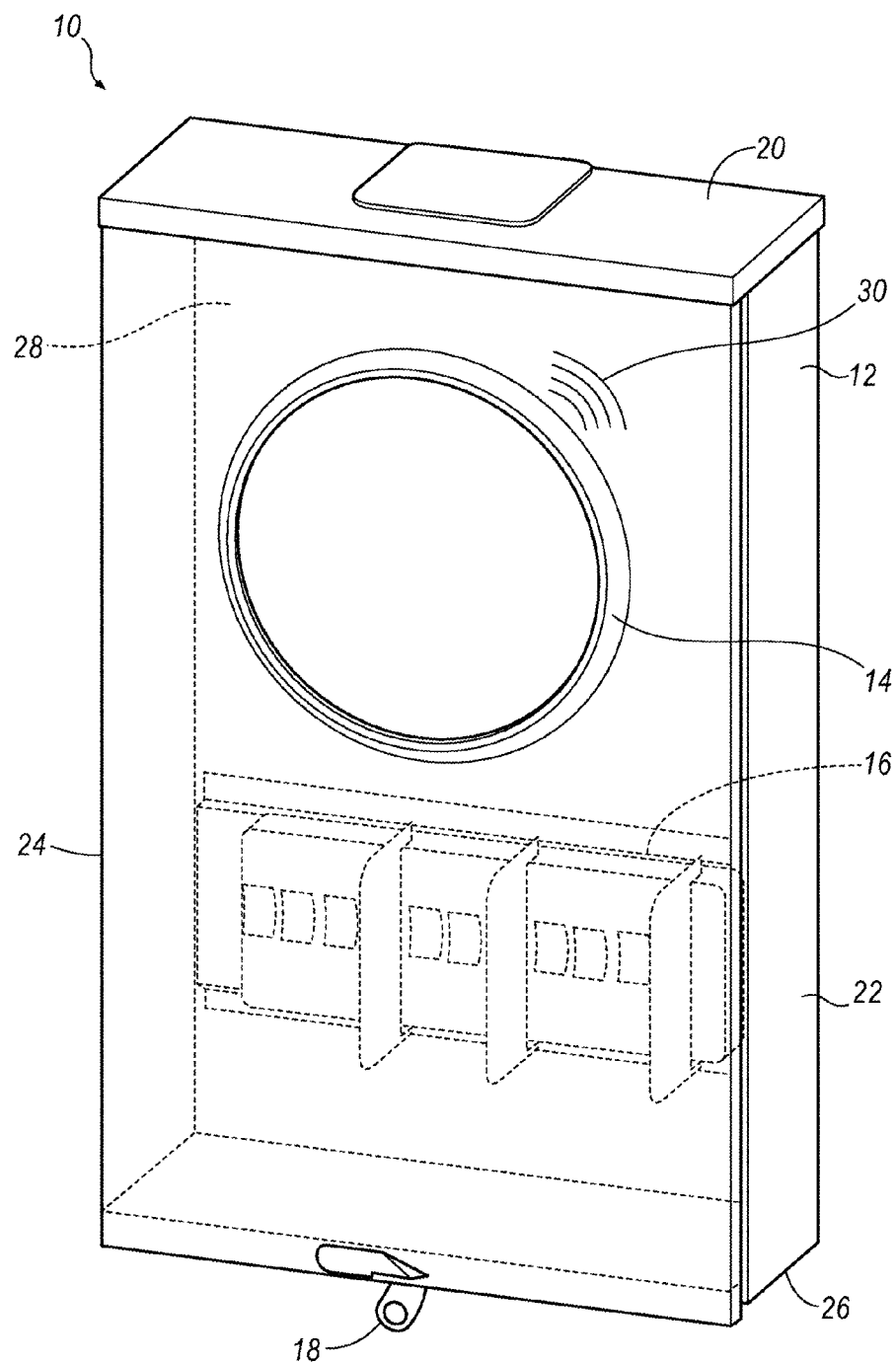
FIG. 1 illustrates a perspective view of a meter box for use in connection with a utility application.

FIG. 1 illustrates a meter box assembly 10 having a meter box 12, a meter 14 and a test switch 16. The test switch 16 assembly is shown in phantom because the lid of the meter box 12 is shown in a closed position. A latch 18 serves to close and help seal the meter box assembly 10 and keep intruders from the interior of the meter box 12.

The meter box 12 includes a top panel 20, side panels 22 and 24, a lower or bottom panel 26, and a back panel 28. The box 12 is preferably made of heavy gauge steel. The box includes mounting features for securely mounting the box 12 in residential and commercial settings. It will be appreciated that the meter box assembly 10 can be used in various utility settings, and is not limited to electrical utility applications, for example, wherever a utility application may utilize a test switch. The improvements herein are contemplated to be utilized.

The test switch 16 is connected to the meter 14 and the meter 14 is operable to transmit signals 30 to an outside sensor node that may be remote from the meter box assembly 10. Thus, the meter box assembly 10 is contemplated to be utilized where it is desired to transmit signals via telemetry, or other measures, which in turn may be picked up by a network where the signal can be received and processed.

Figure 2:
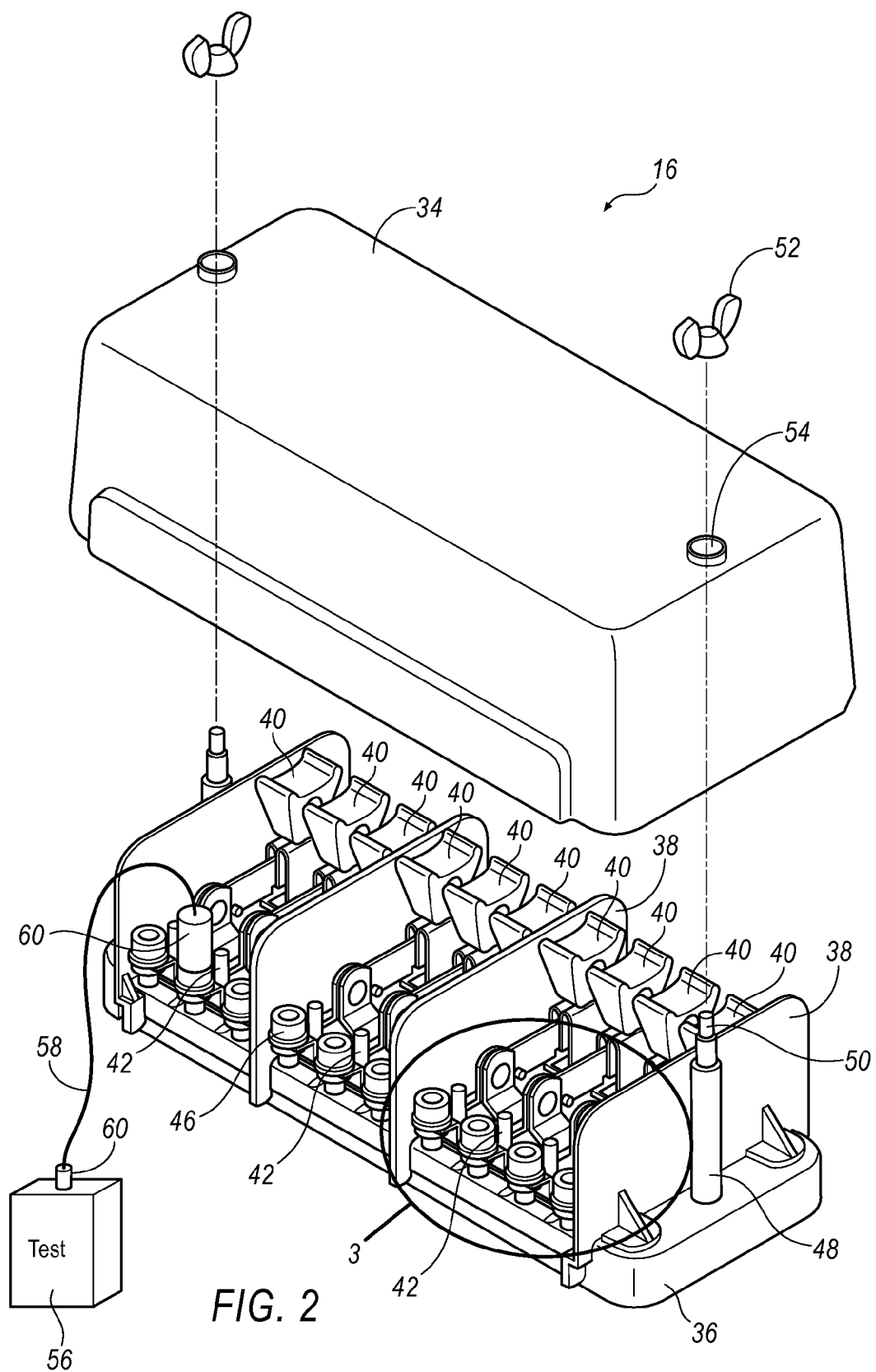
FIG. 2 illustrates a partially exploded view of a test switch with its cover removed, and a banana jack test cord is shown connecting the switch to test equipment.

With reference to FIG. 2, the test switch assembly 16 includes a cover 34, a switch housing 36, a non-conductive barrier 38 and a plurality of individual test switches 40. It will be appreciated that while the present example discloses ten test switches 40 ganged in a common switch housing 36, other quantities of test switches 40 can be arranged, depending upon the desire and the current needs of a utility.

Figure 3:
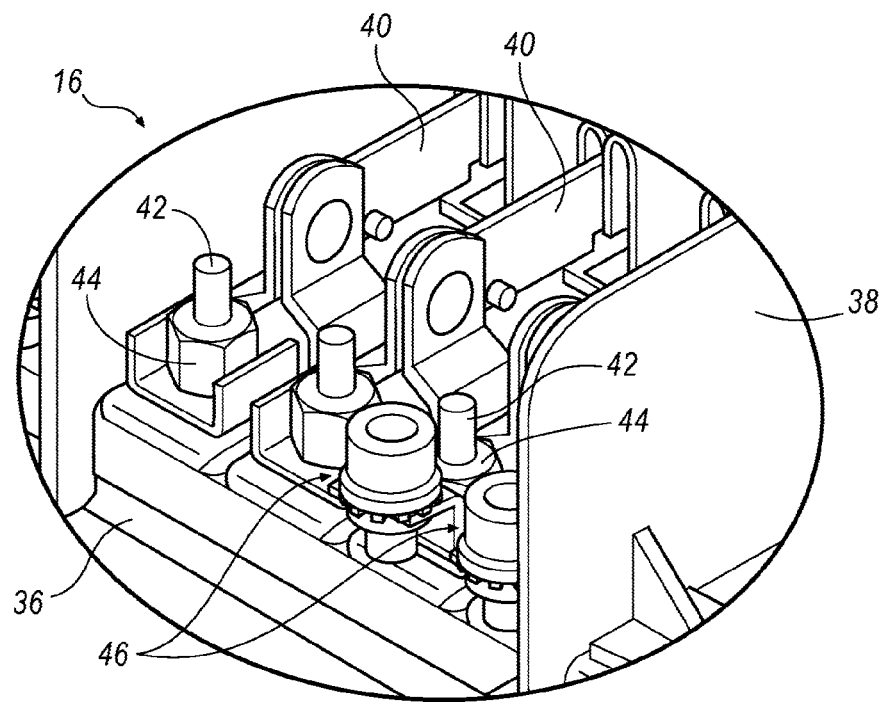
FIG. 3 illustrates an enlarged view taken from circle 3, of FIG. 2.

With reference to FIGS. 2 and 3, the switch housing 36 is preferably made of non-conductive polymer material and is sufficiently rigid and durable to properly support each of the switches 40. The switch housing 36 includes a plurality of studs 42, one for each of the test switches 40. The stud 42 extends up through or is formed as a part of the base of the switch housing 36 and provides a mounting member for each banana jack adapter assembly to be secured thereto. The stud 42 in the present embodiment is threaded which permits a nut 44 to rigidly mount each banana jack adapter assembly 46 to each such stud 42. The switch housing 36 further includes a mounting member 48 with an upwardly extending threaded portion 50 for receiving wing nuts 52. The threaded portion 50 extends through an opening 54 of the cover 34. The cover 34 preferably is made of nonconductive polymer material and is sufficiently rigid to withstand the environmental conditions to which it is exposed. The cover is of traditional size and has not been specially configured to accommodate the improved banana jack adapter assemblies 46. The banana jack adapter assembly 46 can be retro-fit to an existing test switch assembly 16. A kit of banana jack assemblies 46 could be sold or provided where a number of assemblies 46 can be provided that are equivalent to the number of test switches 40 that are housed within the test switch assembly 16.

With continued reference to FIG. 2, the test switch assembly 16 is shown connected to testing equipment 56 via a banana jack test cord 58. The test cord has banana jacks 60 at both ends thereof. This allows a field technician to easily connect the testing equipment 56 to a test switch 40 so that the testing of the meter 14 can be performed. The cover 34 is removed from the switch housing 36 during these testing operations. It will be appreciated that a plurality of cords 58 may be provided for connecting the test equipment 56 to a number of test switches 40.

FIG. 3 illustrates an enlarged perspective view of several test switches 40 that have been positioned on the switch housing 36. It will be appreciated that each test switch 40 has a stud 42 and a nut 44. FIG. 3 illustrates a banana jack adapter assembly 46 mounted to a corresponding switch stud 42 of one of the switches 40. It will be appreciated that a banana jack assembly 46 may be employed with each individual test switch 40, or as is desired by the utility. Alternatively, an assembly 46 may be used on only certain test switches, which is what is shown in FIG. 3. The banana jack adapter assembly 46 operates to replace a test switch ear by now providing a more positive connection arrangement that is operable to receive one end of the banana jack test cord 58 (shown in FIG. 2).

Figure 4:
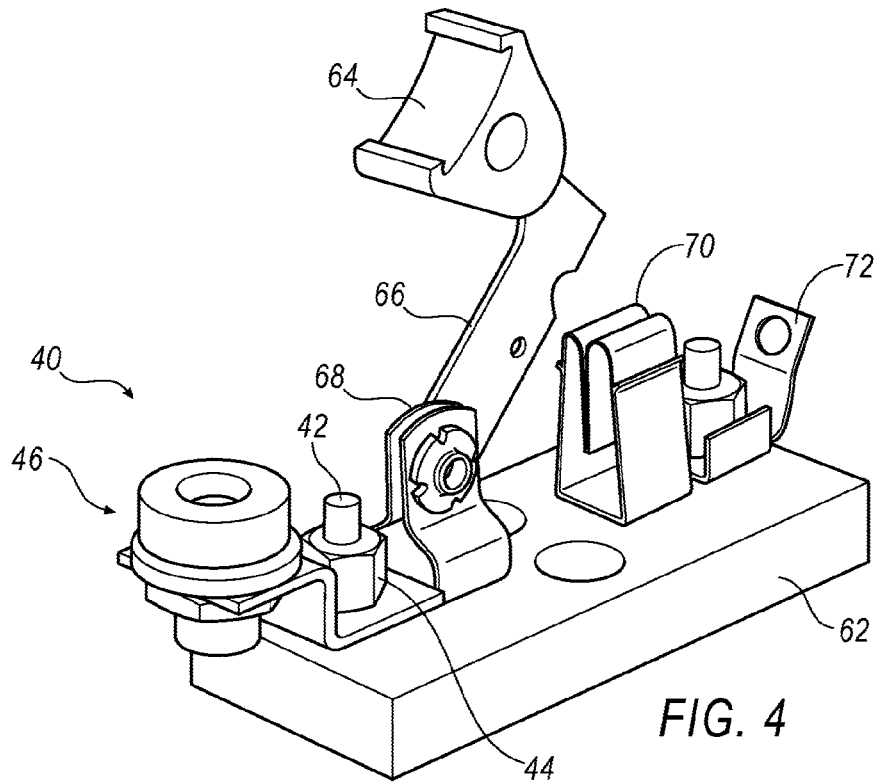
FIG. 4 illustrates a perspective view of a single test switch, showing the banana jack adapter.

FIG. 4 illustrates a perspective view of one improved test switch 40 and its various components. Each test switch 40 includes a molded polymer base 62, a plastic handle 64, a metal switch blade 66, a metal hinge jaw 68, a metal contact jaw 70, and the banana jack adapter assembly 46 that is secured to the switch stud 42 by a nut 44. The test switch 40 also may include a test ear 72 at a location on the base 62 that is opposite the adapter assembly 46.

Figure 5:
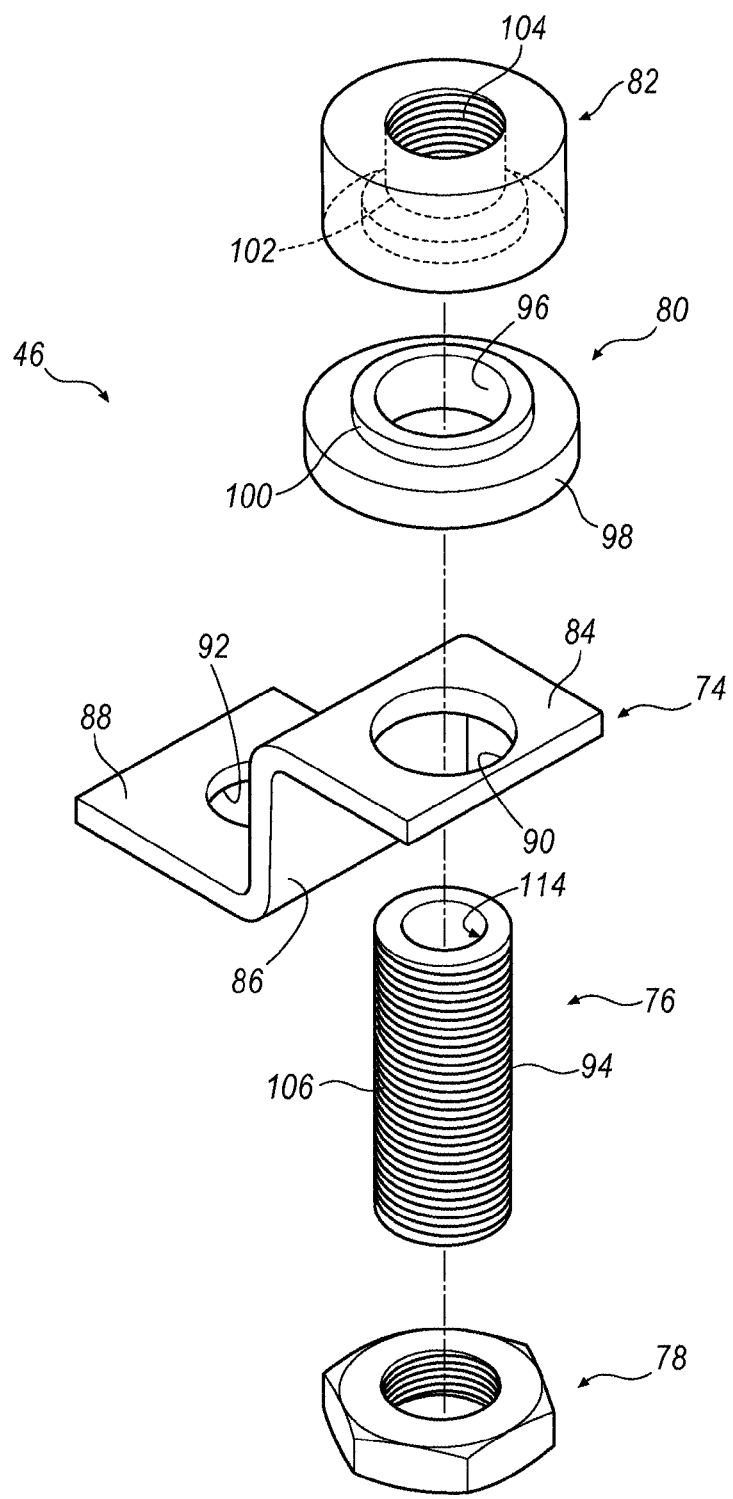
FIG. 5 illustrates an exploded view of the banana jack adapter assembly.

With reference to FIG. 5, an exploded view of the banana jack adapter assembly 46 is depicted. The banana jack adapter assembly 46 includes a Z-shaped metal bracket 74, an elongated threaded body 76, a nut 78, an insulated washer 80, and an insulated head or guide bushing 82. The components share a common central axis to which they are axially aligned. Collectively these components mate together to form a rigid structure that is sufficiently rigid 50 as to allow a technician to insert a jack 60 axially, relative to the central axis, without much movement. Thus, the assembly is robust so as to provide a positive connection point for a field technician to insert and easily remove a test cord 58 having a banana jack.

The Z-shaped bracket 74 could also be L-shaped or other geometric configurations, and is preferably made of highly conductive material such as, but not limited to, copper. The bracket 74 includes a first portion 84, a vertically extending second portion 86 and a horizontally extending third portion 88. The first 84 and third 88 portions have a apertures 90 and 92. The aperture 90 has a diameter sufficiently large to receive the outside diameter 94 of the threaded body 76. Thus, the threaded body 76 can pass through the first portion 84. The aperture 92 is sufficiently large to receive the switch stud 42. The insulated washer 80 has an inside diameter 96 that is operable to receive the outside diameter 94 of the threaded body 76. The insulated washer 80 further has a first outside diameter 98 and a second outside diameter 100, thus creating a stepped type configuration for receiving a corresponding stepped type female configuration 102 that is found on the underside of the guide bushing 82. The guide bushing 82 has internal threads 104 that are operable to receive threads 106 of the threaded body 76. Thus, the nut 78 and the guide bushing 82 tend to thread towards one another, thus causing the threaded body 76 to be sandwiched and firmly secured to the first portion 84 of the bracket 74. It will be appreciated that the bracket 74 can take on other geometric configurations, apart from those exemplaries shown herein. It will also be appreciated that the bushing 82 and washer 80 could be a single component.

Figure 6:
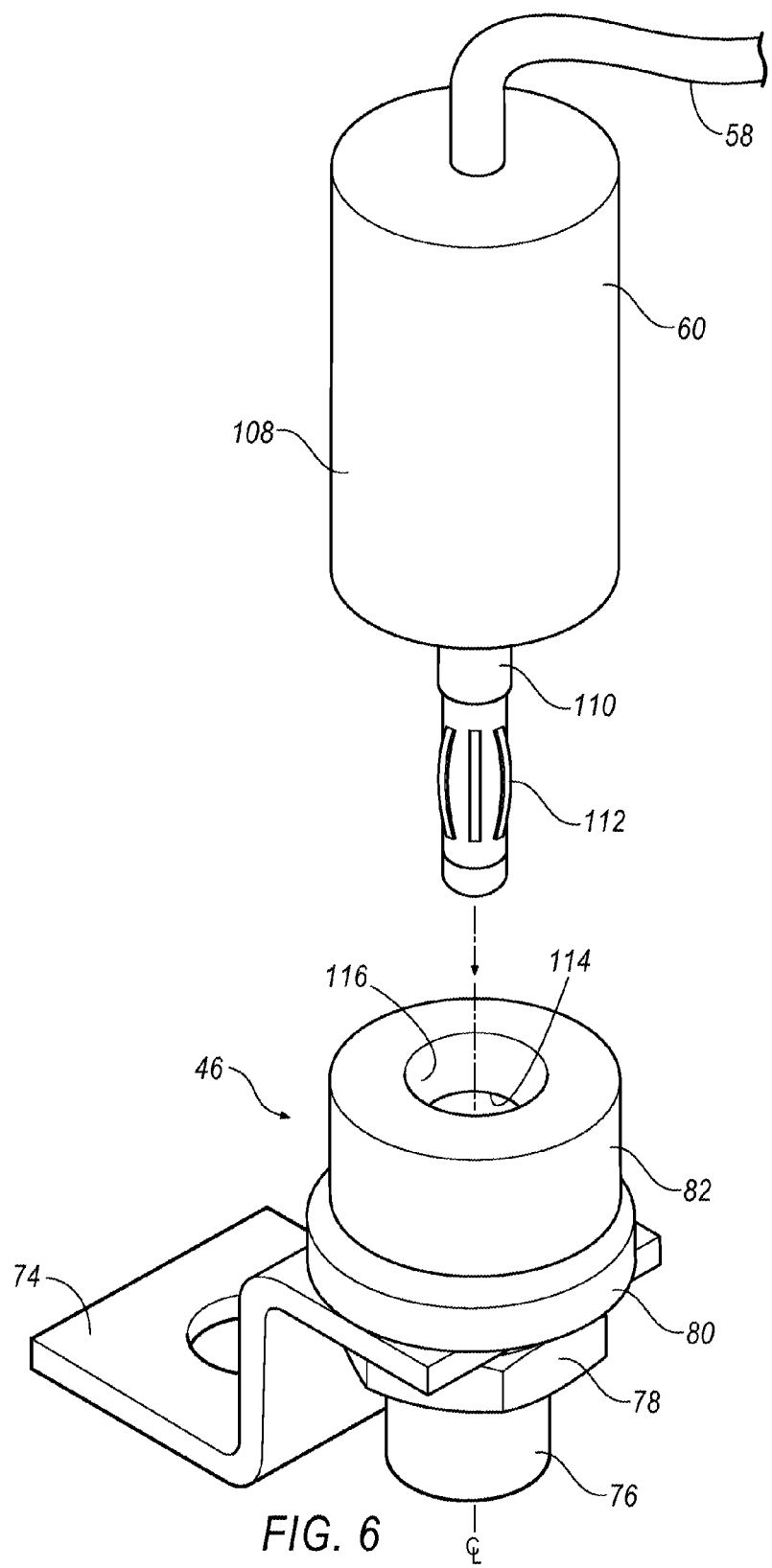
FIG. 6 illustrates the banana jack adapter assembly with a banana jack that can be connected to said assembly.

FIG. 6 illustrates the banana jack assembly 46 shown assembled with a banana jack assembly 60 ready to be deployed into the banana jack assembly 46. The centerlines of the banana jack assembly 60 and the adapter assembly 46 are aligned. The banana jack assembly 60 includes a test cord 58 extending from a housing 108 that is preferably made of molded plastic. A male member 110 extends from the housing 108 and a plurality of pliable members 112 are provided for engagement with an internal diameter 114 of the threaded body 76. As the jack assembly 60 enters the adapter assembly 46, the pliable members 112 engage the internal diameter of the guide bushing 82 as they traverse downwardly into the threaded body 76. This arrangement creates a strong positive electrical connection between the banana jack assembly 60 and the bracket 72 which in turn is connected to a particular test switch 40.

It will be appreciated that the adapter assembly 46 could encompass other configurations. For example, the bracket 74 could be made of an extruded member, with an internal bore for receiving the male member 110 of the banana jack assembly 60. Further, it is contemplated that the body 76 could be press fit within, or relative to, the bracket 74 so as to create a press fit arrangement between these two components, thus removing the need for some of the other aforementioned components that have been employed for securing the member 76 to the bracket 74. It will be appreciated that other arrangements are contemplated for providing an improved test switch ear that is operable to receive a banana jack assembly 60.

It will be appreciated that the aforementioned process and devices may be modified to have some steps or features removed, or may have additional steps or features added, all of which are deemed to be within the spirit of the disclosure. Even though the disclosure has been described in detail with reference to specific embodiments, it will be appreciated that various modifications and changes can be made to these embodiments without departing from the scope of the present invention as set forth in the claims. Accordingly, the specification and the drawings are to be regarded as an illustrative thought instead of merely a restrictive thought of the scope of the disclosure.

What is claimed as new and desired to be protected by Letters Patent of the United States is:

1. A test jack assembly for use in testing meter switches for a utility meter box, comprising:
    a z-shaped bracket having a first portion, a second portion extending from the first portion, and a third portion extending from the second portion, one of said portions having an opening, said bracket is made from conductive material;
    an elongated hollow body having a diameter that is threaded and is smaller than the diameter of the opening in the z-shaped bracket, said body is made of conductive material;
    an insulated washer that has an opening with an internal diameter that is greater than the outside diameter of the threaded body, the washer further having a first outside diameter and a second outside diameter that share a common central axis;
    an insulated member that has an opening with a first internal diameter that is greater than the outside diameter of the threaded body, the insulated member further having a recess that is operable to receive a portion of the insulated washer; and a nut that is operable to be secured to the elongated hollow body.

2. The test jack assembly as claimed in claim 1, further comprising a banana jack male member having an outside diameter that is less than an inside diameter of the elongated hollow body, the banana jack male member is operable to be connected to test equipment.

3. The test jack assembly as claimed in claim 1, further comprising another opening in the z-shaped bracket, which is operable to receive a stud from a test switch.

4. The test jack assembly as claimed in claim 1, further comprising a test switch, the test switch includes a switch stud that is connectable to the z-shaped bracket.

5. A test switch assembly for use with a meter box electrical utility application, comprising:
   a test switch cover;
   a test switch housing; and
   at least one test switch mounted to the test switch hosing, the test switch including:
     a base;
     a contact jaw;
     a hinge jaw;
     a handle;
     a switch blade; and
     a test jack assembly;
   the test jack assembly including:
     a z-shaped bracket having a first portion, a second portion extending from the first portion, and a third portion extending from the second portion, one of said portions having an opening, said bracket is made from conductive material;
     an elongated hollow body having a diameter that is threaded and is smaller than the diameter of the opening in the z-shaped bracket, said body is made of conductive material;
     an insulated washer that has an opening with an internal diameter that is greater than the outside diameter of the threaded body, the washer further having a first outside diameter and a second outside diameter that share a common central axis;
     an insulated member that has an opening with a first internal diameter that is greater than the outside diameter of the threaded body, the insulated member further having a recess that is operable to receive a portion of the insulated washer; and
     a nut that is operable to be secured to the elongated hollow body.

6. The test switch assembly as claimed in claim 5, wherein the z-shaped bracket is made of highly conductive material, such as copper.

7. The test switch assembly as claimed in claim 5, further comprising a plurality of test switches, each such test switch having its own test jack assembly that is operable to receive a banana jack.

8. The test switch assembly as claimed in claim 5, further comprising a test switch barrier.

9. The test switch assembly as claimed in claim 5, test jack assembly is sized to permit the test switch cover to be mounted to the test switch housing without any interference between the receiving member and the cover.

10. The test switch assembly as claimed in claim 5, further comprising a banana jack test cord.

11. The test switch assembly as claimed in claim 5, further comprising a meter box.

12. The test switch assembly as claimed in claim 5, further comprising a meter box and a wireless meter, the test switch is in communication with the meter, the test switch is operable to allow testing and calibration of the meter.

13. The test switch assembly as claimed in claim 5, wherein the test switch further include a switch stud and fastener, the switch stud is operable to receive a hole in the z-shaped bracket and the fastener is operable to secure the test switch to the switch housing.

14. A banana jack adapter assembly for use in testing meter switches for a utility meter box, comprising:
   a z-shaped bracket having a first portion, a second portion extending from the first portion, and a third portion extending from the second portion, one of said portions having an opening, said bracket is made from conductive material, the opening of the bracket being operable to receive a male portion of a banana jack; and
   an elongated hollow body having a diameter that is threaded and is smaller than the diameter of the opening in the z-shaped bracket, said body is made of conductive material, the elongated hollow body having an opening with an inner diameter that is operable to receive a male portion of a banana jack;
   an insulated washer that has an opening with an internal diameter that is greater than the outside diameter of the threaded body, the washer further having a first outside diameter and a second outside diameter that share a common central axis;
   an insulated member that has an opening with a first internal diameter that is greater than the outside diameter of the threaded body, the insulated member further having a recess that is operable to receive a portion of the insulated washer; and
   a nut that is operable to be secured to the elongated hollow body.

15. The banana jack adapter assembly as claimed in claim 14, further comprising a fastener for securing the elongated hollow body to the z-shaped bracket.

16. The banana jack adapter assembly as claimed in claim 14, further comprising a test switch.

17. The banana jack adapter assembly as claimed in claim 14, further comprising a banana jack cord.

* * * * *